Figure 1:
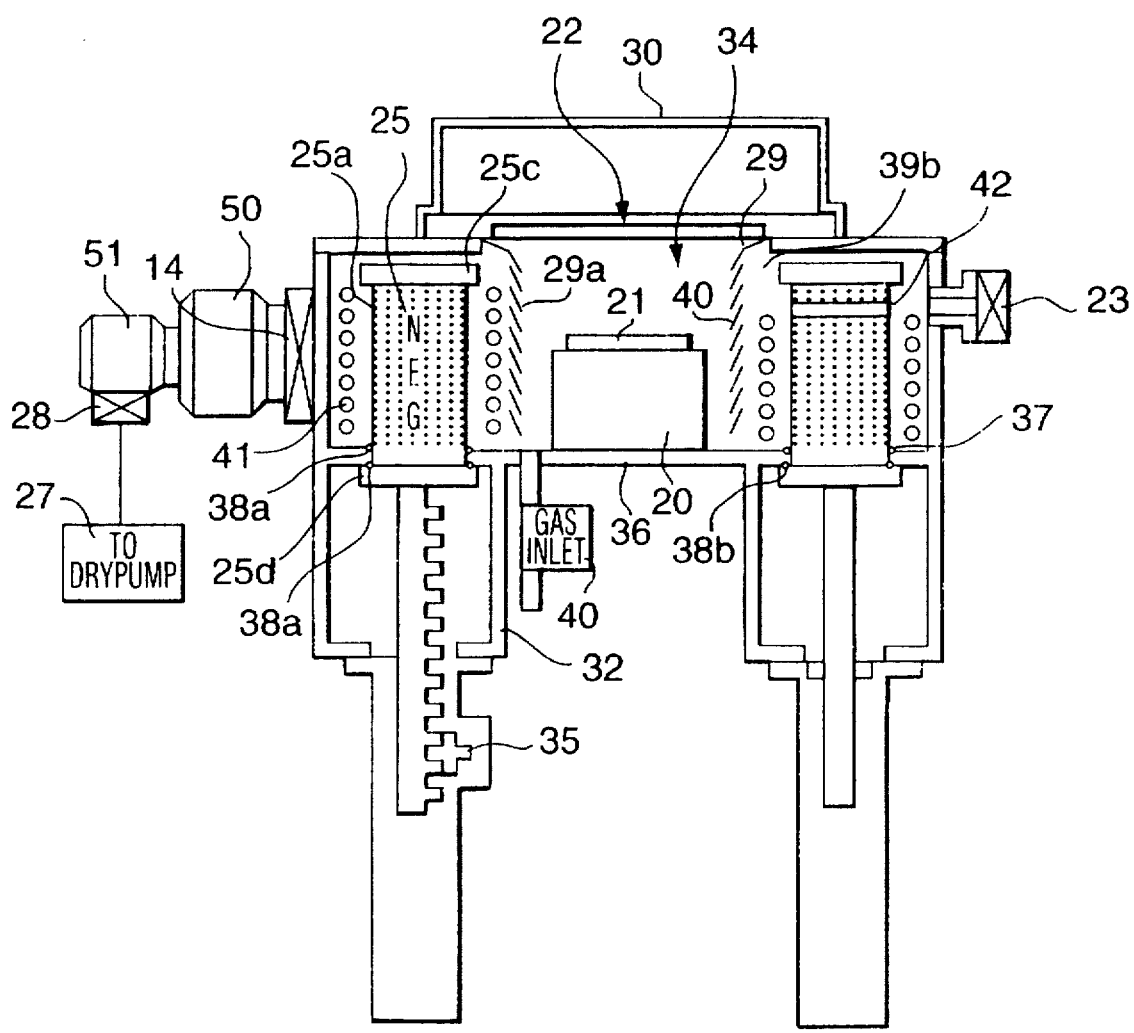

United States Patent [19]

Ouellet

[11] Patent Number: 5,778,682
[45] Date of Patent: Jul. 14, 1998

[54] REACTIVE PVD WITH NEG PUMP

[75] Inventor: Luc Ouellet, Granby, Canada

[73] Assignee: Mitel Corporation, Kanata, Canada

[21] Appl. No.: 666,257

[22] Filed: Jun. 20, 1996

[51] Int. Cl.[6] ............................................. B01D 8/00
[52] U.S. Cl. ............................. 62/55.5; 55/569; 417/901
[58] Field of Search ........................ 62/55.5; 55/269; 417/901

[56] References Cited

U.S. PATENT DOCUMENTS

| | | | |
|---|---|---|---|
| 3,536,418 | 10/1970 | Breaux | 62/55.5 |
| 4,306,887 | 12/1981 | Barosi et al. | 55/68 |
| 4,488,506 | 12/1984 | Heinecke et al. | 62/55.5 |
| 4,599,869 | 7/1986 | Ozin et al. | 62/55.5 |
| 5,238,469 | 8/1993 | Briesacher et al. | 95/115 |

OTHER PUBLICATIONS

SAES Getters—SORB-AC Getter Wafer Modules and Panels.
SAES Getters—St 101 Non-Evaporable Getters.
SAES Getters—SAES Getters Group Bulletin—Mar. '93 No. 3.
SORB-AC Appendage Getter Pumps—SAES Getters.
SAES Vacuum Gauge—Wide Range Spinning Rotor Gauge.
Capacittor—New High Capacity Non-Evaporable Getter Pump.

*Primary Examiner*—Ronald C. Capossela
*Attorney, Agent, or Firm*—Marks & Clerk

[57] ABSTRACT

An apparatus for carrying out reactive physical vapor deposition on a substrate to form a nitride layer, comprises a vacuum chamber, a substrate support in the vacuum chamber, a target over the substrate support made of a refractory or noble metal, for example titanium and tantalum, a gas inlet for supplying nitrogen gas to the vacuum chamber, and a non-evaporable getter pump for serving as the primary pumping means in the vacuum chamber during the reactive physical vapor deposition of a nitride of the metal onto the substrate. The non-evaporable getter pump consists of a material insensitive to nitrogen, such as an alloy of zirconium and iron.

8 Claims, 1 Drawing Sheet

REACTIVE PVD WITH NEG PUMP

This invention relates to a method and apparatus for carrying out physical vapor deposition (PVD) and more particularly in the presence of a reactive gas (reactive PVD), such as nitrogen.

PVD is carried in the semiconductor manufacturing industry to manufacture many different kinds of layers. Two common such layers are TiN, which is used as a barrier layer or anti-reflective coating, and Tantalum nitride ($Ta_2N$), which is used as a resistor in integrated circuits. However, other refractory of noble metals, such as tungsten, can be used to form barrier layers.

In order to form the nitride layer, a wafer is located in a vacuum deposition tool below a target made of the metal, titanium or tantalum in the above example, in the presence of the reactive nitrogen gas and argon at low pressures, typically in the order of 3 mTorr partial pressures and generally in the range of 0.5 to 5 mTorr partial pressure for argon and 0.5 to 1 mTorr partial pressure for nitrogen. The partial pressures of contaminants, such as water vapor should be in the order of $10^{-9}$ torr.

Copending application Ser. No. 08/652,575, the contents of which are herein incorporated by reference and commonly assigned herewith, describes a cluster tool for inter alia carrying out PVD processes. This cluster tool employs a NEG (Non-Evaporable Getter) material, such as is available form SAES Getters S.p.A. of Milan, Italy, as the primary pump from removing contaminants from the vacuum chamber. This tool described in the co-pending application referred to above cannot be used for reactive PVD because while the NEG material used as the pump does not absorb argon, it does absorb nitrogen.

An object of the present invention is to provide a method and apparatus capable of carrying out reactive PVD processes in the presence of nitrogen.

According to the present invention there is provided an apparatus for carrying out reactive physical vapor deposition on a substrate to form a nitride layer, comprising a vacuum chamber, a substrate support in said vacuum chamber, a target over said substrate support made of a refractory of noble metal, a gas inlet for supplying nitrogen gas to said vacuum chamber, and a non-evaporable getter pump for serving as the primary pumping means in said vacuum chamber during the reactive physical vapor deposition of a nitride of said metal onto said substrate, said non-evaporable getter pump consisting of a material insensitive to nitrogen, such as an alloy consisting essentially of zirconium and iron.

The refractory metal, i.e. one capable of withstanding high temperatures, or the noble metal can be, for example, titanium or tantalum, or any other suitable metal for making barrier layers, such as tungsten.

Because non-evaporable getters (NEG) made of such materials are insensitive to nitrogen, reactive PVD can be carried out in a vacuum chamber without the need for heavy duty turbomolecular and cryopumps that would otherwise be need to attain the required low pressures of the contaminants, in the order of $10^{-9}$ torr and below.

In a preferred embodiment, the NEG pump comprises an alloy consisting of 15 to 30% by weight of Fe and from 70 to 85% by weight Zr. Such NEG materials are described, for example, in U.S. Pat. No. 5,238,469.

The invention also provides a method a method for carrying out reactive physical vapor deposition on a substrate, comprising the steps of placing a substrate in a vacuum chamber in the presence of an NEG pump; reducing the pressure sufficiently to activate the NEG pump; introducing nitrogen gas into the vacuum chamber; depositing a refractory or noble metal nitride layer on said substrate; and continually removing contaminants from the vacuum chamber with a non-evaporable getter pump, said non-evaporable getter pump consisting of a material insensitive to nitrogen, such as an alloy consisting essentially of zirconium and iron.

The invention will now be described in more detail, by way of example only, with reference to the accompanying drawings, in which the single FIGURE is a diagrammatic cross section of a vacuum tool for carrying out reactive physical vapor deposition.

The vacuum tool shown in the FIGURE is similar to that described in our copending application referred to above. A wafer 21 is located on a support 20, which serves as a backside heater, in deposition chamber 34. Target 22, which is made of titanium or tantalum, is mounted over the wafer 21 in the deposition chamber. The target serves as the cathode in the reactive PVD process, and the wafer serves as the anode.

A removable cap 30 is located over the target 22 to allow the chamber 34 to be opened for access, for example, to permit the target 22 to be removed.

A tandem arrangement of turbomolecular pumps 50, 51 connected through valve 28 to dry pump serves to create the initial vacuum of about $10^{-5}$ Torr prior to introduction of the NEG pump 25. Pump 50 is a V550 turbopump and pump 51 is a V70LP turbopump.

The donut or ring-shaped NEG pump 25 normally surrounds the wafer 21 and support 20, providing a wafer heater. It is mounted on a ratchet mechanism 31 extending into a sealed cylindrical antechamber 32 below main deposition chamber 34. The ratchet mechanism includes a pawl 35, which allows the NEG pump to be raised into the operative position shown and withdrawn into a retracted position within the antechamber 32. The pawl 35 can be turned by hand or by a small electric motor. Alternatively, any suitable raising and lowering means can be employed.

The bottom wall 36 of the deposition chamber 34 has a circular aperture 37 accommodating the ring-shaped getter pump 25. The ring-shaped pump 35 has a slightly recessed body portion 25a so as to form an upper lip 25c and a lower lip 25d.

Pairs of O-rings 38a, 38b, and 39a, 39b are provided on the respective outer and inner surfaces of the NEG pump 25 respectively above the lower and below the upper lips 25d, 25c.

In the raised position shown the O-rings 38a, 38b seal against lower surface of the bottom wall of the chamber 34. In the retracted position (not shown) the O-rings 39a, 39b seal against the upper surface of the bottom wall of the chamber 34.

The protection shield 29 includes a plurality of baffle plates 29a extending to the bottom wall 36 so as to completely shield the wafer 21 and support 20. A slit 40 is formed in the baffle plates 29a and a slit 41 is formed in the NEG pump 25 to allow the wafers to pass therethrough en route to the isolation valve 23 (and vice versa).

The bottom wall 36 also includes a gas inlet valve 40 for the continual admission of argon and nitrogen to the deposition chamber 34 during reactive physical vapor deposition. The total pressure of nitrogen can be easily controlled by controlling the flow rate through the valve 40 and the pumping speed of the pumps 50, 57. Generally the partial pressure of nitrogen should be in the range 0.5 to 10 mTorr, typically 3 mTorr, and the partial pressure of argon should be in the range 0.5 to 5 mTorr, typically 3 mTorr.

The ring-shaped getter pump 25 is surrounded by a stack of infrared lamps 41 for heating the getter material 25 for the purpose of activation or regeneration. Infrared lamps are preferred to the constantin support described with reference to the previous embodiment.

In normal operation, the NEG pump 25 is in the raised position shown. The infrared lamps 41 are operated for the purpose of activating or regenerating the NEG material 25. They can also be used to heat the NEG material during wafer processing because the pumping speed increases significantly with temperature. It is desirable to operate the NEG pump 25 at a temperature of about 280° C.

When it is desired to open the deposition chamber 34, for example, to replace the target 22, the NEG pump is withdrawn into the antechamber 33 and sealed with the aid of seals 38a, 38b. A vacuum is maintained in antechamber 33, which is temporarily in communication with the main deposition chamber 34 in the intermediate positions of the NEG pump 25. The NEG material is thus not exposed to the atmosphere while the deposition chamber 34 is open.

The infrared lamps 41 can also serve the dual purpose of baking the walls of the deposition chamber to drive off absorbed gases for regeneration purposes.

The NEG pump 25 is made from a sintered mass of NEG material shaped in an array of 240 (25 cm×5 cm) fins distributed over a cylinder 25 cms high and having an outside diameter of 45 cms with a total surface area of 60,000 cm$^2$.

The infrared lamps are used to activate the NEG pump at 450° C. for 45 minutes at 10$^{-5}$ Torr and hold the NEG pump at 200° C. for normal operation.

The V550/V70LP tandem turbopump configuration can be used to prevent gas backstreaming from the drypump and maintain a partial pressure lower than about 10$^{-10}$ Torr for contaminants, such as $H_2$, $H_2O$, and $O_2$.

In accordance with the invention, the NEG pump is made from an alloy consisting essentially of an alloy of zirconium and iron, preferably consisting of 15 to 30% by weight of Fe and from 70 to 85% by weight Zr. A suitable alloy is sold by SAES getters S.p.A. of Milan, Italy under the trade designation St101 Getter Alloy. Such an alloy is described in the above-referenced U.S. Pat. No. 5,238,469.

The invention brings about a revolutionary advance in the field of PDV processing. The copending application referred to above is an extremely important advance because it allows the elimination of the bulky and expensive turbomolecular pumps and cryopumps that had previously been associated with cluster tools. However, it was not contemplated that the invention would be applicable to reactive PVD because NEG getters generally absorb gases, such as nitrogen, that are able to take part in a reaction. The realization that NEG getters are available that are insensitive to nitrogen is extremely important because it allows reactive PVD to be carried out in the same way, i.e. without the need for large cryopumps and the like. The formation of titanium and tantalum nitride layers is an extremely important as aspect of semiconductor wafer fabrication, and the ability to extend to former invention to such processes is very important.

It should be obvious that the above described embodiments are merely illustrative of the application and of the principles of the present invention, and numerous modifications thereof may be devised by those skilled in the art without departing from the spirit and scope of the invention.

I claim:

1. An apparatus for carrying out reactive physical vapor deposition on a substrate to form a nitride layer, comprising a vacuum chamber; a substrate support in said vacuum chamber; a target over said substrate support made of a metal selected from the group consisting of a refractory metal and noble metal; a gas inlet for supplying nitrogen gas to said vacuum chamber; and a non-evaporable getter pump for serving as the primary pumping means in said vacuum chamber during the reactive physical vapor deposition of a nitride of said metal onto said substrate, said non-evaporable getter pump consisting of a material insensitive to nitrogen.

2. An apparatus as claimed in claim 1, wherein said material is an alloy of zirconium and iron.

3. An apparatus as claimed in claim 2, wherein said alloy consists of 15 to 30% by weight of Fe and from 70 to 85% by weight Zr.

4. An apparatus as claimed in claim 1, wherein said metal is selected from the group consisting of titanium, tantalum, and tungsten.

5. A method for carrying out reactive physical vapor deposition on a substrate, comprising the steps of placing a substrate in a vacuum chamber in the presence of an NEG pump; reducing the pressure sufficiently to activate the NEG pump; introducing nitrogen gas into the vacuum chamber; depositing a metal nitride layer on said substrate, said metal being selected from the group consisting of a refractory metal and noble metal; and continually removing contaminants from the vacuum chamber with a non-evaporable getter pump, said non-evaporable getter pump consisting of a material insensitive to nitrogen.

6. A method as claimed in claim 5, wherein said material consists essentially of an alloy of zirconium and iron.

7. A method as claimed in claim 6, wherein said alloy consists of 15 to 30% by weight of Fe and from 70 to 85% by weight Zr.

8. A method as claimed in claim 5, wherein said metal is selected from the group consisting of titanium, tantalum, and tungsten.

* * * * *